United States Patent
Jackson et al.

(10) Patent No.: US 9,130,179 B2
(45) Date of Patent: Sep. 8, 2015

(54) ELECTRONIC DEVICES

(75) Inventors: Martin Jackson, Saffron Walden (GB); Catherine Ramsdale, Cambridge (GB); Jerome Joimel, Milton (GB)

(73) Assignee: PLASTIC LOGIC LIMITED, Cambridge (GB)

( * ) Notice: Subject to any disclaimer, the term of this patent is extended or adjusted under 35 U.S.C. 154(b) by 156 days.

(21) Appl. No.: 13/988,399

(22) PCT Filed: Nov. 25, 2011

(86) PCT No.: PCT/EP2011/071070
§ 371 (c)(1),
(2), (4) Date: Jul. 26, 2013

(87) PCT Pub. No.: WO2012/069650
PCT Pub. Date: May 31, 2012

(65) Prior Publication Data
US 2013/0299815 A1    Nov. 14, 2013

(30) Foreign Application Priority Data
Nov. 26, 2010    (GB) .................................. 1020049.1

(51) Int. Cl.
H01L 51/05    (2006.01)
H01L 27/28    (2006.01)

(52) U.S. Cl.
CPC .......... *H01L 51/0512* (2013.01); *H01L 27/283* (2013.01); *H01L 51/0541* (2013.01); *H01L 51/0545* (2013.01)

(58) Field of Classification Search
CPC .................................................. H01L 51/0512
USPC ........................................................ 438/59
See application file for complete search history.

(56) References Cited

U.S. PATENT DOCUMENTS

| | | | |
|---|---|---|---|
| 6,452,207 B1 | 9/2002 | Bao | |
| 6,596,569 B1 | 7/2003 | Bao et al. | |
| 2004/0056297 A1 | 3/2004 | Iki et al. | |
| 2004/0257489 A1 | 12/2004 | Gotoh et al. | |
| 2007/0272948 A1 | 11/2007 | Koo et al. | |
| 2008/0080221 A1 | 4/2008 | Koo et al. | |
| 2008/0116457 A1* | 5/2008 | Park et al. | 257/59 |
| 2008/0272361 A1 | 11/2008 | Lim | |
| 2010/0127254 A1 | 5/2010 | Lai et al. | |

FOREIGN PATENT DOCUMENTS

EP    2 172 972 A2    4/2010

OTHER PUBLICATIONS

International Search Report of PCT/EP2011/071070 dated Mar. 1, 2012.
United Kingdom Search Report of GB1020049.1 dated Mar. 20, 2012.

* cited by examiner

*Primary Examiner* — Lex Malsawma
(74) *Attorney, Agent, or Firm* — Sughrue Mion, PLLC

(57) ABSTRACT

A device comprising an array of transistors, including: patterned conductive layers located at lower and upper levels in a stack of layers on a substrate, which patterned conductive layers define gate conductors and source-drain electrodes of the array of transistors; wherein the stack of layers further comprises a dielectric layer below said lower level, and a further patterned conductive layer below said dielectric layer; and wherein said further patterned conductive layer both provides an electrical function in said array of transistors via said dielectric layer, and defines openings via which the dielectric layer serves to increase the strength of adhesion between the device substrate and the patterned conductive layer at said lower level.

12 Claims, 2 Drawing Sheets

ELECTRONIC DEVICES

CROSS REFERENCE TO RELATED APPLICATIONS

This application is a National Stage of International Application No. PCT/EP2011/071070 filed Nov. 25, 2011, claiming priority based on United Kingdom Patent Application No. 1020049.1, filed Nov. 26, 2010, the contents of all of which are incorporated herein by reference in their entirety.

The present invention relates to electronic devices including an array of transistors. In one embodiment, it relates to electronic devices including an array of transistors formed on an organic substrate.

Device substrates including a plastic, polymer base and an organic planarising layer on the upper surface of the polymer base are used for producing electronic devices with improved flexibility. International Patent Application No. PCT/EP2010/057863 identifies the challenge of achieving good adhesion between the organic surface of such a device substrate and the bottom conductive layer of an array of thin-film transistors, and discloses the technique of providing an intermediate aluminium nitride layer between said organic surface and said bottom conductive layer.

The inventors for the present invention have identified the challenge of further improving the functionality of this additional intermediate layer.

There is provided a device comprising an array of transistors, including: patterned conductive layers located at lower and upper levels in a stack of layers on a substrate, which patterned conductive layers define gate conductors and source-drain electrodes of the array of transistors; wherein the stack of layers further comprises a dielectric layer below said lower level, and a further patterned conductive layer below said dielectric layer; and wherein said further patterned conductive layer both provides an electrical function in said array of transistors via said dielectric layer, and defines openings via which the dielectric layer serves to increase the strength of adhesion between the device substrate and the patterned conductive layer at said lower level.

In one embodiment, the further patterned conductive layer defines an array of conductive elements for capacitative coupling via said dielectric layer with overlying conductive elements at said lower level.

In one embodiment, the further patterned conductive layer defines an array of conductive elements for capacitative coupling via said dielectric layer with parts of said lower level conductive layer connected within said lower level conductive layer to a drain electrode.

In one embodiment, said parts of said lower level conductive layer connected within said lower level conductive layer to a drain electrode provide bases for respective conductive interlayer links to a higher level.

In one embodiment, the further patterned conductive layer defines further gate conductors for the array of transistors.

In one embodiment, the array of transistors includes both bottom-gate transistors in which the gate conductor is formed below the source-drain electrodes, and top-gate transistors in which the gate conductor is formed above the source-drain electrodes; and wherein the further patterned conductive layer defines gate conductors for the bottom-gate transistors.

In one embodiment, the device substrate comprises an organic upper surface.

In one embodiment, the device substrate comprises an organic polymer support coated with an organic planarising layer.

In one embodiment, the dielectric layer comprises an inorganic material.

In one embodiment, the stack further includes layers of organic material to provide the semiconductor channels between the source-drain electrodes, and gate dielectric elements between the semiconductor channels and overlying gate conductors.

In one embodiment, the dielectric layer has a dielectric constant of greater than about 5.

In one embodiment, the dielectric layer has a dielectric constant between about 5 and about 9.3.

Embodiments of the present invention are described in detail, hereunder, by way of example only, with reference to the accompanying drawings, in which:

FIG. 1(a) is a plan view of the metal layers of a section of a TFT array according to a first embodiment of the present invention;

FIG. 1(b) illustrates a cross-section through line C-C in FIG. 1(a);

FIG. 2(a) is a plan view of the metal layers of a section of a mixed TFT array according to a second embodiment of the present invention;

FIG. 2(b) illustrates a cross-section through line A-A in FIG. 2(a); and

FIG. 2(c) illustrates a cross-section through line B-B in FIG. 2(a).

In both the first and second embodiments, a sheet of device substrate material 14 is temporarily secured to a rigid, glass carrier (not shown) via an adhesive element (not shown), such as an adhesive element including one or more acrylic adhesive layers. The sheet of device substrate material 14 provides a plurality of device substrates, which are later cut from the device substrate material sheet 14 after the completion of the processing of the device substrates in situ on the carrier. The rigid carrier does not form part of the product devices, and the adhesive element includes one or more layers made of an adhesive whose tackiness can be reduced by the action of heat or UV irradiation to allow the device substrates to be released from the carrier at a later stage of the production process.

The device substrate material sheet 14 comprises, for example, a film of polyethyleneterephtalate (PET) coated with a planarising layer. Another example of a plastic substrate for this kind of device is a film of polyethylenenaphtalene (PEN) coated with a planarising layer.

The planarising layer provides a uniform, smooth surface on which to fabricate the transistor elements. For example, the planarising layer could be composed of a UV-cured acrylic coating or a thermal cured nanosilica/polysiloxane coating. Other examples of suitable organic planarising materials are cyanoacrylates, epoxies, fluoropolymers, plasticsol and acrylates. The planarising layer may be deposited using techniques, such as, blade coating, screen printing, flexographic printing, spray coating, ink-jet printing or spin-coating or slit-coating.

Figure 1:
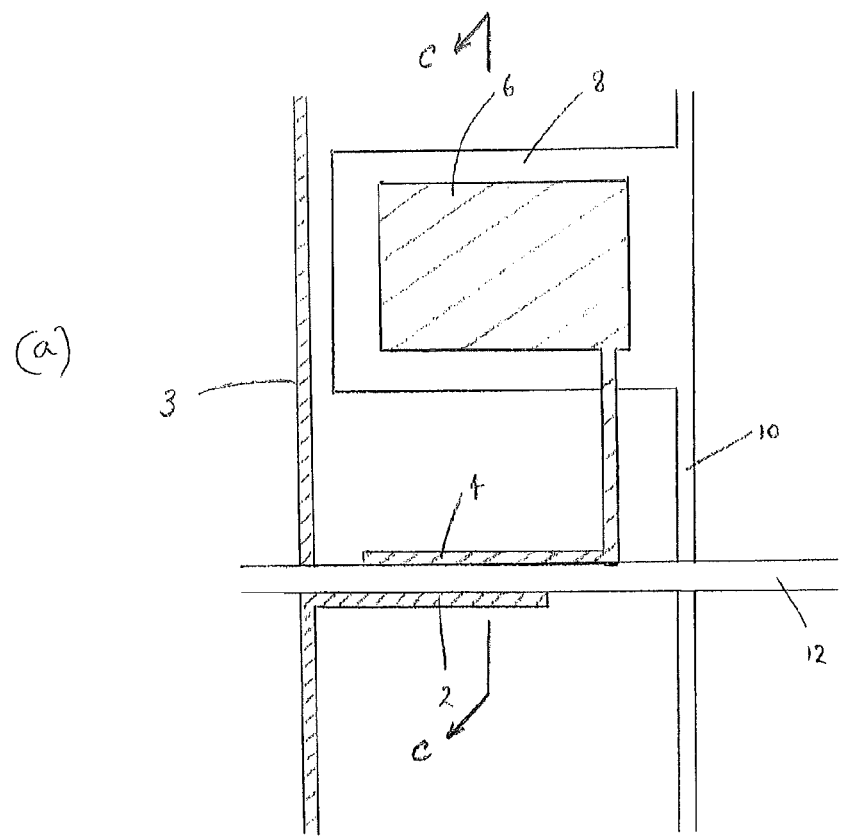
FIGS. 1 and 2 illustrate TFT arrays, according to first and second embodiments of the present invention. The TFT arrays are useful, for example, as the backplane for a display device, to control a front plane including an optical display medium, such as a liquid crystal display medium or an electrophoretic display medium.
Figure 1:
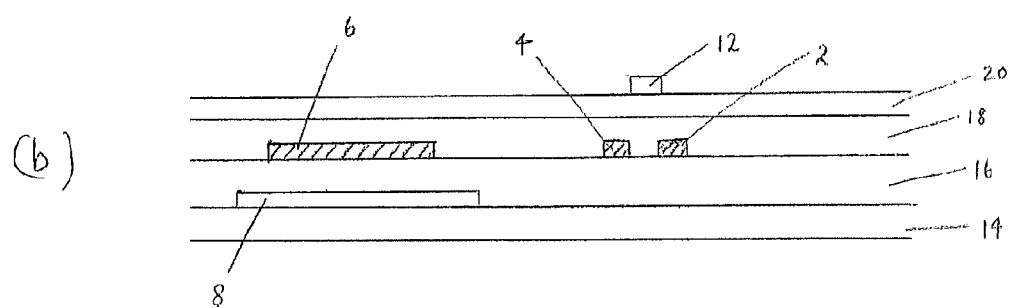

In the first embodiment illustrated in FIG. 1, a layer of a metal such as gold is then deposited by a physical vapour deposition technique such as sputtering over the entire surface of the planarising layer, and the metal layer is subjected to a patterning technique such as photolithography to define conductive elements 8 to couple capacitatively with conductive drain pads 6 at a higher level of the respective TFT array.

The same patterned metal layer also defines conductive lines 10 that provide an electrically conductive link between the conductive elements 8.

An inorganic dielectric material such as aluminium nitride is then deposited by sputter coating over the substrate sheet 14 and patterned metal layer in the form of a continuous film 16.

A second layer of a metal such as gold is then deposited directly on the nitride layer 16 by a physical vapour deposition technique such as sputtering, and the metal layer is subject to a patterning technique such as photolithography to define the source-drain electrode pairs 2, 4, drain pads 6 and source signal lines 3 of each array of transistors. The gap between each source-drain electrode pair defines the width of the semiconductor channel of the respective transistor. The drain pads 6 are connected to respective drain electrodes 4 via a conductive link, and provide the base of a respective interlayer conductive connection to a respective pixel electrode (not shown) at a higher level of the TFT array. Each drain pad also overlaps and capacitatively couples with a respective conductive element 8 at a lower level of the TFT array. The conductive elements 8 are designed to be bigger than the overlying drain pads 6 with the aim of ensuring a consistent and reliable capacitative coupling between the conductive elements 8 and the drain pads 6, even if there is some variation in the relative locations of the conductive elements 8 and drain pads, resulting from, for example, distortion of the substrate during the production process. The capacitative coupling between the conductive elements 8 and the drain pads serves to reduce the kick-back voltage exhibited by the transistors, and improve drive performance when the TFT array is used to control the optical display medium of a display device.

The lower metal layer defining the conductive elements 8 and conductive lines 10 is designed so as to minimize overlap and capacitative coupling between this lower metal layer (including the conductive lines 10) and the source lines 3.

The next step involves forming the remaining elements of the TFT arrays. The remaining elements include a layer of organic polymeric semiconductor material 18 to provide semiconductor channels between the source-drain electrode pairs, one or more layers of organic polymeric dielectric material to provide gate dielectric elements separating each semiconductor channel from the gate electrode of the same transistor, and gate lines 12 which provide the gate electrodes and means for addressing each transistor; and other elements such as pixel electrodes (not shown) conductively connected to respective drain electrodes 4 via respective drain pads 6 and interlayer connections.

Once, the backplane TFT arrays are completed, the front planes (not shown) comprising the display medium are laminated to the backplane, and the product devices are separated from each other by cutting the sheet of substrate material 2 and releasing the resulting device substrates from the rigid carrier.

Figure 2:
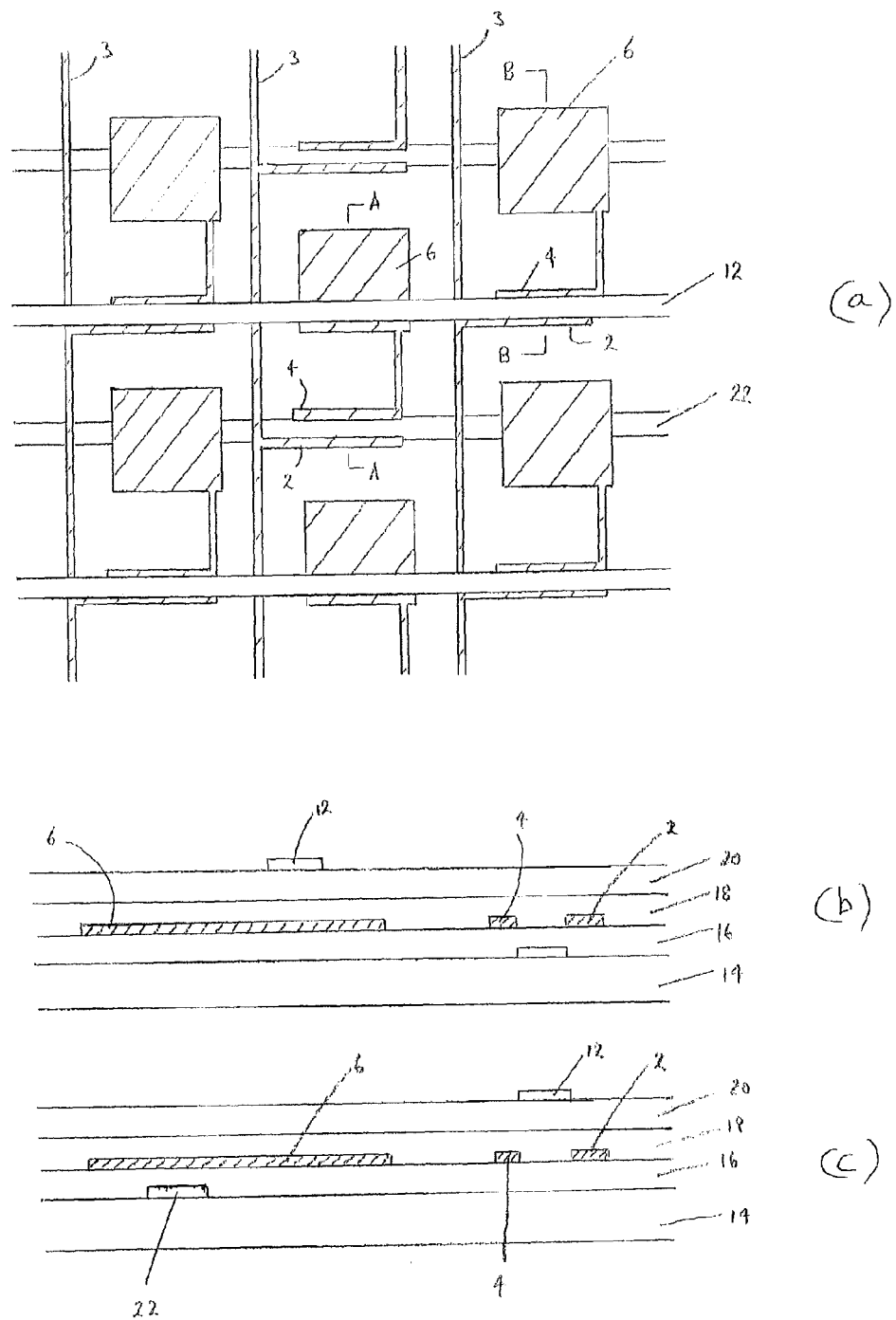

In the embodiment illustrated in FIG. 2, the TFT array comprises a mixed array of top-gate and bottom-gate transistors.

A layer of a metal such as gold is deposited by a physical vapour deposition technique such as sputtering over the entire surface of the planarising layer, and the metal layer is subjected to a patterning technique such as photolithography to define gate lines 22 for the bottom-gate TFTs of the mixed array. Each gate line 22 underlies the semiconducting channels between the source/drain electrode pairs of a respective series of bottom-gate TFTs, and provides means for addressing each of the bottom-gate transistors.

An inorganic dielectric material such as aluminium nitride is then deposited by sputter coating over the substrate sheet 14 and patterned lower metal layer in the form of a continuous film 16.

A second layer of a metal such as gold is then deposited directly on the nitride layer 16 by a physical vapour deposition technique such as sputtering, and the metal layer is subject to a patterning technique such as photolithography to define the source-drain electrode pairs 2, 4, drain pads 6 and source signal lines 3 of each mixed array of bottom-gate and top-gate transistors. The gap between each source-drain electrode pair defines the width of the semiconductor channel of the respective transistor. The drain pads 6 are connected to respective drain electrodes 4 via a conductive line within the same patterned metal layer, and provide the base of a respective interlayer conductive connection to a respective pixel electrode (not shown) at a higher level of the TFT array.

The next step involves forming the remaining elements of the TFT arrays. The remaining elements include a layer of organic polymeric semiconductor material 18 to provide semiconductor channels between the source-drain electrode pairs, one or more layers of organic polymeric dielectric material to provide gate dielectric elements for the top-gate TFTs separating each semiconductor channel from the gate electrode of the respective top-gate transistor, and gate lines 12 which provide the gate electrodes for the top-gate TFTs and means for addressing each of the top-gate transistors; and other elements such as pixel electrodes (not shown) conductively connected to respective drain electrodes 4 via respective drain pads 6 and interlayer connections.

Once, the backplane TFT arrays are completed, the front planes (not shown) comprising the display medium are laminated to the backplane, and the product devices are separated from each other by cutting the sheet of substrate material 2 and releasing the resulting device substrates from the rigid carrier.

For both the first and second embodiments, examples of alternative materials for the conductive layer that provides the source-drain electrode pairs 2, 4 etc. are materials that have a resistivity of lower than about 5 ohm/square, and a high work function of at least about 5 electron volts. Alternatively, a bi-layer of two metallic materials can be used in order to achieve both a high conductivity and a high work function. Examples of combinations of conductive materials are: silver (Ag) and copper (Cu); and nickel oxide (NiO) and palladium (Pd).

In the first and second embodiments, the organic, polymeric semiconductor material is deposited by flexographic printing. The solution concentration and deposition conditions are chosen so as to produce a dry solid film of semiconductor of a thickness preferably in the region of about 50 nm. Examples of suitable semiconductor materials include: poly (9,9'-dioctylfluorene-co-bis-N,N')-(4-butylphenyl)diphenylamine (TFB) and other polyfluorenes, such as poly(dioctylfluorene-co-bithiophene) (F8T2); polythiophenes, pentacene or pentacene derivatives (such as Triisopropylsilylethynyl (TIPS) pentacene). Other examples of coating techniques for depositing the semiconductor material are spin-coating, dip coating, blade coating, bar coating slot-die coating, or spray coating, inkjet, gravure, offset or screen printing, sputter coating and vapour deposition.

In both the first and second embodiments, the one or more layers of organic polymeric gate dielectric material are also deposited by flexographic printing. The materials and solvents for the deposition of the semiconductor and gate dielectric materials are carefully selected in accordance with the technique described in WO01/47043 with the aim of minimising degradation of the semiconductor layer by the process of depositing the overlying gate dielectric layer. Other examples of coating techniques for depositing the organic, polymeric gate dielectric material(s) are spin-coating, dip coating, blade coating, bar coating slot-die coating, or spray coating, inkjet, gravure, offset or screen printing, sputter coating and vapour deposition.

Examples of suitable solution-processible, organic polymeric gate dielectric materials that may be used are: polystyrene (PS), polymethylmethacrylate (PMMA), which is soluble in e.g. ethylacetate; Cytop®, which is an amorphous fluoropolymer available from AGC Chemicals Europe, Ltd, and which is soluble in e.g. a perfluoro solvent such as perfluorotributylamine (FC43); and polyisobutylene (PIB). Each gate dielectric element may have a multilayer construction, comprising a stack of two or more layers of different dielectric materials between the semiconducting layer and the upper gate line/electrode 12.

In the first and second embodiments, the upper gate lines 12 are provided by depositing an upper layer of metal such as gold by a physical vapour deposition technique such as sputtering, and subjecting the metal layer to a patterning technique such as photolithography. Examples of other suitable materials for the gate lines/electrodes 12 include other highly conductive metals, such as copper (Cu), a solution-processible material containing inorganic nanoparticles of silver or other metals, and a conducting polymer such as PEDOT/PSS. The conductive layer for forming the gate lines can be deposited using other vapour-deposition techniques such as evaporation. Alternatively, the conductive layer for forming the gate lines can be deposited by coating a solution-processible conductive material (or precursor thereto) onto the underlying gate dielectric layer(s). Examples of suitable coating techniques include spin, dip, blade, bar, slot-die, gravure, offset or screen or inkjet printing.

In both the first and second embodiments, the insulating nitride layer 16 serves three functions: (i) providing a dielectric layer for capacitive coupling between the conductive elements 8 and the drain pads 6 (in the embodiment illustrated in FIG. 1), or providing a gate dielectric element for the bottom gate transistors of the mixed TFT array (in the embodiment illustrated in FIG. 2); (ii) improving the adhesion between the organic substrate 14 and the middle metal layer (defining the source/drain electrode pairs 2, 4) via the openings in the lower patterned conductive layer; and (iii) serving as a barrier protecting the overlying electronic elements (and any other overlying sensitive elements) from the ingress of moisture and oxygen via the plastic substrate 14.

For (ii), the level of adhesion between the insulating nitride layer 16 and the source/drain electrode pairs 2, 4 is found to be sufficiently high to make it unnecessary to use an intermediate non-noble metal layer as an adhesion promoter layer for the source/drain electrodes. The increase in adhesion provided by the insulating nitride layer 16 can be confirmed by the ASTM D3359-09 Standard test method for measuring the adhesion of the metal on the substrate by the use of a tape test. In more detail, a blade is used to cut parallel lines into the subject layer of the test, (i.e. the metal layer whose adhesion to an underlying substrate is to be measured) to create a grid pattern of cut lines. An adhesive tape is placed over the grid and smoothed out to make good contact with the grid-patterned subject layer. The adhesive tape is then pulled back using the free end to a 180 degree angle, and the thus exposed grid-patterned subject layer is inspected for adhesion failure. By means of this test, it was demonstrated that the insulating nitride layer 16 improves the adhesion of the middle metal layer to the underlying planarisation layer of the device substrate sheet 14. Good adhesion is characterised by no detachment of the subject layer in the grid squares.

It has been found that the purity level of the nitride at the surface of the nitride layer 16 on which the gold is deposited can affect the adhesion promoting performance of the nitride layer 16. In this embodiment of the invention, steps are taken to reduce the atomic percentage of oxygen at the surface of the nitride layer 16. Firstly, sputtering of the nitride layer 16 is carried out after pumping down the sputtering chamber to a base pressure of lower than about 1E-4Pa, and leaving the substrate at such low pressure for a length of time. This reduces the oxygen level present in the sputtering chamber, and also reduces the amount of oxygen present in the plastic substrate sheet 14 in the form of moisture. Baking the substrate at said low pressure will further assist the outgasing of the plastic substrate sheet 15 and the reduction of the amount of oxygen in the sputtering chamber. Also, after sputter-deposition of the nitride layer 16, the nitride layer 16 is subjected to a plasma treatment, such as an argon (Ar) or nitrogen ($N_2$) plasma treatment. The inventors have found that a good degree of adhesion between the overlying gold layer and the nitride layer 16 can be achieved with an atomic purity of more than 90% (i.e. a nitride surface that includes less than 10 atomic percent oxygen).

For (iii), it is thought that one significant route for contaminants such as moisture and oxygen to reach the electronic elements in this kind of production process is via the adhesive layer(s) of the adhesive element used to secure the device substrate material sheet 14 to the rigid carrier, including the interface between an adhesive layer and the device substrate material sheet 16. In particular, it is thought that the adhesive layer(s) provide a route for the ingress of such contaminants via their interface with other layers, such as the overlying device substrate material sheet 14 in FIGS. 1 and 2. The nitride layer 16 provides a barrier against the ingress of such species. The nitride layer 16 is configured to provide a water vapour transmission rate (WVTR) of no more than about 1 to $10^{-7}$ $g/m^2/day$ (e.g. 0.5 $g/m^2/day$), as measured under the following conditions: atmospheric pressure; 100% relative humidity; and a temperature of 38° C. A water vapour permeation instrument provided by Mocon, Inc. can be used to measure the water vapour transmission rate.

The nitride layer 16 could be replaced by another intermediate layer or a stack of intermediate layers that fulfils functions (i) and (ii), and preferably also function (iii). A dielectric layer having a dielectric constant above about 5 is found to be particularly advantageous. For example, a 50 nm layer of sputtered aluminum nitride has a dielectric constant of between about 8.9 and 9.3.

Examples of other materials for intermediate dielectric layer 16 are other inorganic nitrides and inorganic oxides that are electrically insulating, particularly those that are suitable for deposition by sputter coating or other vapour deposition techniques. A polymer type material with a relatively high dielectric constant could also be used.

There is no need to pattern intermediate nitride layer 16 to avoid shorts between elements of the middle metal layer, which is advantageous from the point of view of reducing the number of process steps, and reducing the risk of bowing and/or other distortion of the multilayer stack during processing. A resistivity of at least 5E12 Ohms/sq for the intermediate layer was found to be sufficient to prevent significant leakage current between source and drain electrodes via the intermediate layer 16. Moreover, not having to pattern intermediate layer 16 by a photolithographic technique involving the use of a solvent/etchant has the advantage of better avoiding the risk of a build up of solvent residue underneath the middle metal layer. The existence of solvent residue is generally undesirable because it can diffuse through the device affecting the overall performance and stability of the device.

In one embodiment, Ti/Au is used for the bottom conductive layer, but copper is considered to be better from the point of view of achieving good adhesion and preventing unwanted removal during the process of photolithographically patterning the bottom conductive layer of portions of the bottom conductive layer that are intended to remain as part of the device.

We have chosen the example of a display backplane comprising an active matrix array of TFTs for the purpose of describing embodiments of the invention. However, the techniques described above also have application in other arrangements of TFTs with or without other components such as interconnects, resistors, and capacitors. Examples of other applications include logic circuits, active matrix circuitry for a memory device, and a user-defined gate array circuit. Also, for the above description of techniques in accordance with embodiments of the present invention, we have chosen the example of forming a plurality of TFT arrays on a sheet of device substrate material and then later dividing the sheet of substrate material into individual device substrates. However, the same kind of techniques are also applicable to the case where one or more device substrates are secured individually to carrier before forming one or more electronic elements on the device one or more device substrates.

In addition to any modifications explicitly mentioned above, it will be evident to a person skilled in the art that various other modifications of the described embodiment may be made within the scope of the invention.

The invention claimed is:

1. A device comprising an array of transistors, including:
    patterned conductive layers located at lower and upper levels in a stack of layers on a substrate, which patterned conductive layers define gate conductors and pairs of source and drain electrodes of the array of transistors, and drain pads each connected to a respective drain electrode and providing the base of a respective interlayer conductive link to a higher level; and
    a semiconductor layer providing semiconductor channels between the source and drain electrodes of the source-drain electrode pairs;
    wherein the stack of layers further comprises a dielectric layer below said lower level, and a further patterned conductive layer below said dielectric layer; and
    wherein said drain pads overlap with said further patterned conductive layer via said dielectric layer without overlapping of said semiconductor channels with said further patterned conductive layer; and
    wherein said further patterned conductive layer defines openings via which the dielectric layer serves to increase the strength of adhesion between the device substrate and the patterned conductive layer at said lower level.

2. A device according to claim 1, wherein the device substrate comprises an organic upper surface.

3. A device according to claim 2, wherein the device substrate comprises an organic polymer support coated with an organic planarising layer.

4. A device according to claim 1, wherein the dielectric layer comprises an inorganic material.

5. A device according to claim 1, wherein the semiconductor layer comprises an organic material, and the stack further includes a layer of organic material to provide gate dielectric elements between the semiconductor channels and overlying gate conductors.

6. A device according to claim 1, wherein the dielectric layer has a dielectric constant of greater than about 5.

7. A device according to claim 6, wherein the dielectric layer has a dielectric constant between about 5 and about 9.3.

8. A device comprising an array of transistors, including:
    a first patterned conductive layer defining source-drain electrodes of the array of transistors; and
    patterned upper and lower conductive layers above and below the first patterned conductive layer;
    wherein the patterned upper and lower conductive layers both define gate lines for the array of transistors;
    wherein the array of transistors includes a mixed array of bottom-gate transistors and top-gate transistors; the lower patterned conductive layer defines a set of bottom gate lines; and the upper patterned conductive layer defines a set of top gate lines, each top gate line located between a respective pair of the bottom gate lines.

9. A device according to claim 8, wherein both the bottom-gate transistors and the top-gate transistors include drain pads, each drain pad providing a base for an interlayer conductive connection to a respective pixel electrode at a higher level.

10. A device according to claim 9, wherein the top gate lines comprise one or more gate lines that overlap one or more of said drain pads; and said one or more of said drain pads overlap one or more of said bottom-gate lines.

11. A device according to claim 8, wherein each top-gate line provides gate electrodes for a respective group of said top-gate transistors, and each bottom-gate line provides gate electrodes for a respective group of said bottom-gate transistors.

12. A device according to claim 8, wherein each top gate line is associated with a respective group of said top-gate transistors, each one of said group of top-gate transistors being addressable by the same top-gate line; and wherein each bottom gate line is associated with a respective group of said bottom-gate transistors, each one of said group of bottom-gate transistors being addressable by the same bottom gate line.

* * * * *